(12) United States Patent
Crane, Jr. et al.

(10) Patent No.: US 7,070,340 B2
(45) Date of Patent: Jul. 4, 2006

(54) HIGH PERFORMANCE OPTOELECTRONIC PACKAGING ASSEMBLY

(75) Inventors: Stanford W. Crane, Jr., Santa Clara, CA (US); Myoung-Soo Jeon, Fremont, CA (US); Joshua G. Nickel, San Jose, CA (US); Zsolt Horvath, Fremont, CA (US)

(73) Assignee: Silicon Bandwidth Inc., Fremont, CA (US)

( * ) Notice: Subject to any disclaimer, the term of this patent is extended or adjusted under 35 U.S.C. 154(b) by 246 days.

(21) Appl. No.: 10/073,963

(22) Filed: Feb. 14, 2002

(65) Prior Publication Data

US 2003/0044130 A1    Mar. 6, 2003

Related U.S. Application Data

(63) Continuation-in-part of application No. 09/940,649, filed on Aug. 29, 2001, now Pat. No. 6,663,294.

(51) Int. Cl.
*G02B 6/42* (2006.01)

(52) U.S. Cl. ...................................... 385/92

(58) Field of Classification Search ............ 385/92–94; 257/99, 678, 692, 693, 698
See application file for complete search history.

(56) References Cited

U.S. PATENT DOCUMENTS

| 4,802,178 | A | * | 1/1989 | Ury ............................ 372/36 |
|---|---|---|---|---|
| 4,873,566 | A | | 10/1989 | Hokanson et al. |
| 4,920,262 | A | * | 4/1990 | Aiki et al. ............. 250/227.11 |
| 5,005,178 | A | * | 4/1991 | Kluitmans et al. ............ 372/36 |
| 5,436,997 | A | | 7/1995 | Makiuchi et al. |
| 6,207,950 | B1 | * | 3/2001 | Verdiell ....................... 250/239 |
| 6,252,726 | B1 | * | 6/2001 | Verdiell ....................... 359/820 |
| 6,498,294 | B1 | * | 12/2002 | Kuwahara et al. ......... 174/52.3 |
| 6,663,294 | B1 | * | 12/2003 | Crane et al. ................... 385/92 |

FOREIGN PATENT DOCUMENTS

JP    2001-237482 A    *    8/2001

* cited by examiner

*Primary Examiner*—John D. Lee
*Assistant Examiner*—Mike Stahl
(74) *Attorney, Agent, or Firm*—McKenna Long & Aldridge LLP

(57) ABSTRACT

Optoelectronic packaging assemblies for optically and electrically interfacing a protected electro-optical device or system to both an optical fiber and to external circuitry. Such assemblies are comprised of body components that are comprised of plastic that coated or plated with a conductive material. Electrical contact pins in the form of transmission lines are used to couple external electrical signals with the package. The optoelectronic packaging assemblies are dimensioned with small cavities and with steps, breaks, walls, and/or fins molded into the body components. The optoelectronic packaging assemblies further include an optical input receptacle for receiving an optical ferrule and an optical fiber. The optoelectronic packaging assembly provides for cooling, such as by heat sink fins and/or a thermal-electric-cooler. The transmission line pins and body components are dimensioned to mate with a standardized circuit board having transmission line traces.

65 Claims, 14 Drawing Sheets

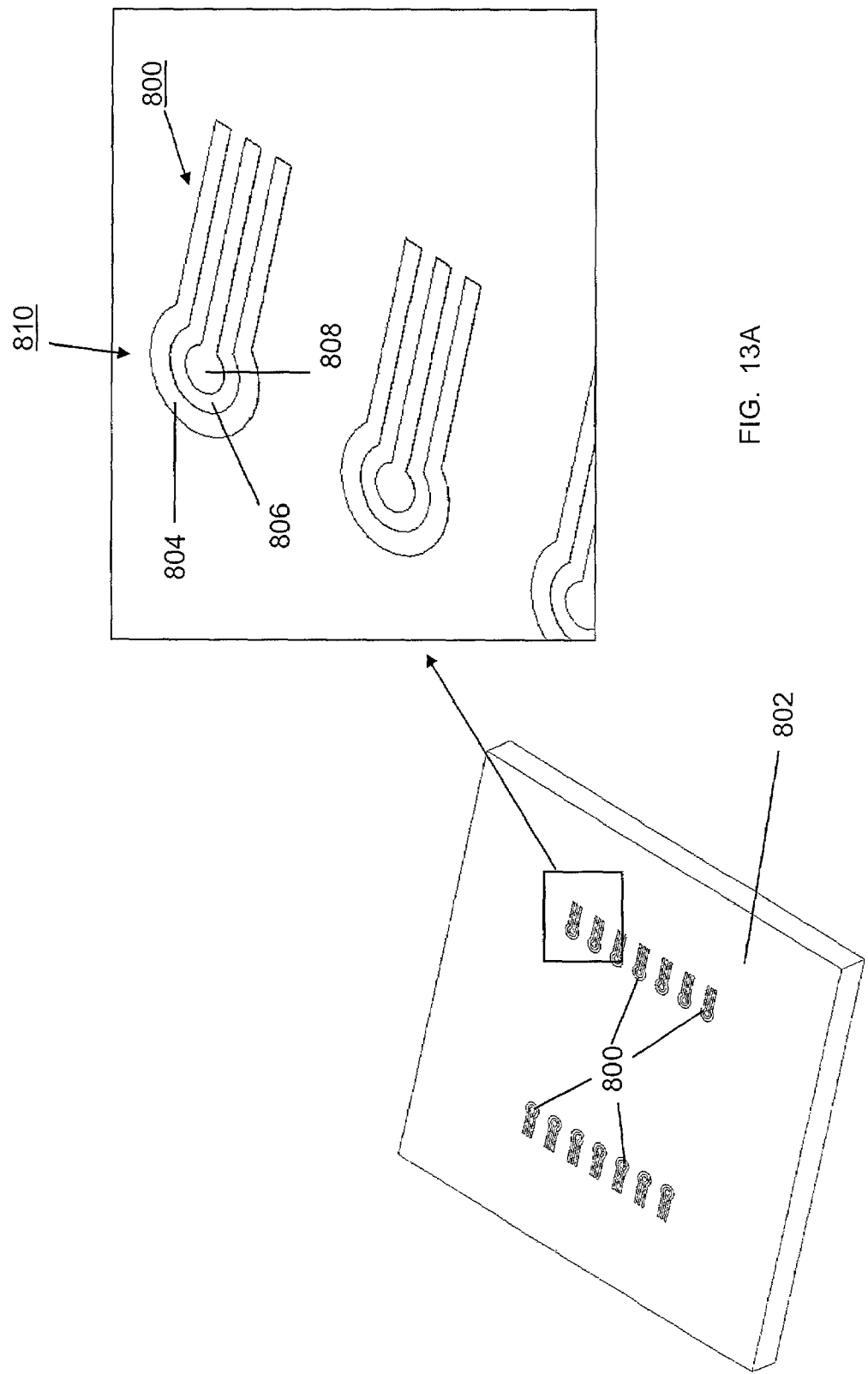

HIGH PERFORMANCE OPTOELECTRONIC PACKAGING ASSEMBLY

CROSS-REFERENCE TO RELATED APPLICATIONS

This is a continuation-in-part of U.S. patent application Ser. No. 09/940,649, which was filed on Aug. 29, 2001, and is now U.S. Pat. No. 6,663,294.

BACKGROUND OF THE INVENTION

1. Field of the Invention

This invention relates to the packaging of optoelectronic devices. More particularly, the present invention relates to optoelectronic packaging assemblies that provide for optical coupling, cooling, and high-speed electrical operations.

2. Discussion of the Related Art

Despite advances in data- and telecommunications systems, overall system bandwidths remain limited by the need to interconnect various system modules. Decreasing device sizes have not solved fundamental signal flow bottlenecks, the problems have only shifted to package, module, and interconnection levels. Despite rapid improvements in electromagnetic simulation tools and increasing computational power, signal flow issues still requires a designer's full attention and creativity in the research and development phases. More importantly, practical signal flow designs must engage various mechanical, thermal, hermetic, material, and manufacturability concerns to meet cost targets and customer specifications Signal flow in optoelectronic applications frequently involves analog and/or digital signals together with light radiation through optical fibers. Such applications usually include optoelectronic devices, such as laser diodes, LEDs, photodiodes, and phototransistors that must be coupled with an optical fiber. One significant problem is coupling with the required alignment accuracy and stability over time and temperature. Manually aligning optical components with optical fibers is time consuming and costly.

Because of the extremely high frequencies of the light used in optical systems, such systems can potentially operate with exceptionally wide bandwidths. Unfortunately, the electrical systems required to actually use the available bandwidth are often difficult to implement. For example, most prior art optoelectronic packages when operated at GHz frequencies have excessive dielectric signal losses. Furthermore, electrical signal reflections caused by impedance mismatches at the package can be seriously detrimental to system performance. Additionally, undesired electrical resonance can exist inside an optoelectronic package, resulting in a poor performance.

To prevent excessive dielectric signal losses, optoelectronic packaging should be fabricated from dielectric materials having low dissipation factors. Unfortunately, such materials often have undesirable cost, thermal, and molding characteristics. For example, polytetrafluoroethylene, which has very low dielectric loss, may be too expensive for some application and can be difficult to mold. To reduce line reflections, the optoelectronic package should have carefully controlled input impedances, but this has been very difficult to do, particularly in mass-produced optoelectronic packaging assemblies. Finally, preventing or reducing undesired electrical resonance has been as much black art as solid engineering.

One optoelectronic package assembly that has been successful, at least at relatively low operating frequencies, is the so-called butterfly package 20 illustrated in FIG. 1. As shown, the package 20 includes a body 22 having a cavity 24 defined between walls 25. The body 22 is typically comprised of KOVAR, a bulky, marginally conductive material that requires costly machining. The cavity 24 is dimensioned to receive an optoelectronic component or assembly, which is not shown for clarity. A plurality of pins 26 extends from the body 22. The body 22 further includes a mounting flange 28 having mounting holes 30 for mounting the package 20 to an external structure. The body 22 also includes a fiber input receptacle 32 for receiving an optical fiber. Finally, while not shown for clarity, the optoelectronic packaging assembly 20 beneficially includes a cover for sealing the cavity 24.

The package 20 represents an industry standard package. Among other features, the pins 26 have a standard footprint, and the mounting holes 30 and the receptacle 32 are located and dimensioned according to a predetermined configuration. This enables system designers to efficiently incorporate the package 20 into their designs. Furthermore, the standard footprint and dimensions enable the use of standardized optoelectronic workbenches and assembly machines to mount optoelectronic components or assemblies into the optoelectronic packaging assembly 20, to align an optical fiber with the mounted optoelectronic components or assemblies, and to electrically interconnect the optoelectronic components or assemblies to the pins 26. These general features are beneficially incorporated in mass-produced optoelectronic packaging assemblies.

While the package 20 is generally successful, it suffers from various limitations. First, such optoelectronic packaging assemblies generally have poor heat dissipation characteristics. Second, the walls 25 tend to be relatively high, thus increasing the difficulty of mounting and then electrically and optically interconnecting a contained optoelectronic component or assembly with an optical fiber. Other limitations of the package 20 are its relatively poor control of the impedance of the pins 26, a susceptibility to internal resonance, and signal radiation and/or noise pick-up.

Therefore, an optoelectronic packaging assembly that provides for input/output electrical connections, for easy mounting of an optoelectronic device and its associated components, for relatively simple, accurate and stable optical alignment, and for high speed electrical characteristics would be beneficial.

SUMMARY OF THE INVENTION

The following summary of the invention is provided to facilitate an understanding of some of the innovative features unique to the present invention, and is not intended to be a full description. A full appreciation of the various aspects of the invention can be gained by taking the entire specification, claims, drawings, and abstract as a whole.

An advantage of the present invention is to provide for optoelectronic packaging assemblies that support easy mounting of optoelectronic devices, relatively simple, accurate and stable optical alignment between a packaged optoelectronic device and an optical fiber, good thermal performance, and improved high-speed electrical characteristics. In particular, the principles of the present invention provide for optoelectronic packaging assemblies having improved adjacent pin isolation, improved radiation suppression, reduced noise, reduced signal reflections, and reduced resonance.

Beneficially, such optoelectronic packaging assemblies are implemented as enhanced replacements for traditional butterfly packages. Instead of KOVAR (used in many prior art packages), optoelectronic packaging assemblies in accord with the present invention are beneficially fabricated from nonconductive plastic, such as liquid crystal polymers (LCP). Instead of simple electrical leads, connections to optoelectronic packaging assemblies in accord with the present invention are made using transmission line pins comprised of an inner conductor, a dielectric sheath, and a conductive outer shield. Electromagnetic shielding, chassis ground, and tight control of radiated emissions are implemented by employing surface metallization on the nonconductive plastics (LCP). To further enhance electrical performance, optoelectronic packaging assemblies in accord with the present invention avoid large interior cavities that can have resonance frequencies on the same order as the operating speeds (i.e. 5–40 GHz). Furthermore, optoelectronic packaging assemblies in accord with the present invention beneficially include molded breaks, steps, and angled walls that reduce the parallel plate wave guide modes excited between the package walls.

A first embodiment optoelectronic packaging assembly that is in accord with the principles of the present invention includes a cover, a submount, and a base that are beneficially comprised of nonconductive plastic having a conductive coating or plating over a surface. The submount retains a plurality of transmission line pins that extend from a cavity within the submount to the exterior. The transmission line pins are each comprised of an inner conductor encased by a dielectric sheath that is surrounded by a conductive outer shield. The first embodiment optoelectronic packaging assembly further includes an optical input receptacle for retaining an optical fiber. The cover, submount and base fit together to form a package. Beneficially, the nonconductive plastic is a liquid crystal polymer. Furthermore, beneficially, the cover includes beveled walls and/or heat sink fins. A thermal electric cooler is optional.

A second embodiment optoelectronic packaging assembly that is in accord with the principles of the present invention includes a cover, a submount, and a base that are beneficially comprised of nonconductive plastic having a conductive coating or plating over a surface. The submount retains a plurality of transmission line pins that extend from a cavity. The transmission line pins are each comprised of an inner conductor encased by a dielectric sheath that is surrounded by a conductive outer shield. The submount further includes barriers between adjacent transmission line pins. Those barriers have a conductive material over a surface. The cover, submount, and base form a package that beneficially electrically shields the cavity, which preferably includes beveled walls and/or heat sink fins. Beneficially, the nonconductive plastic is beneficially a liquid crystal polymer. The base can include a thermally conductive plate, beneficially a plate that mates with an external structure. A thermal electric cooler is optional.

A third embodiment optoelectronic packaging assembly that is in accord with the principles of the present invention includes a cover, a submount, and a base that are beneficially comprised of nonconductive plastic having a conductive coating or plating over a surface. The submount retains a plurality of transmission line pins that extend from a cavity within the submount to the exterior. The transmission line pins are each comprised of an inner conductor encased by a dielectric sheath that is surrounded by a conductive outer shield. The first embodiment optoelectronic packaging assembly further includes an optoelectronic device disposed between the submount and the base. Also included is an optical input receptacle for retaining an optical fiber. The cover, submount and base fit together to form a package. Beneficially, the nonconductive plastic is a liquid crystal polymer. The transmission line pins preferably bend in the direction of the base. Beneficially, the cover includes beveled walls and/or heat sink fins. A thermal electric cooler is optional.

The novel features of the present invention will become apparent to those of skill in the art upon examination of the following detailed description of the invention or can be learned by practice of the present invention. It should be understood, however, that the detailed description of the invention and the specific examples presented, while indicating certain embodiments of the present invention, are provided for illustration purposes only because various changes and modifications within the spirit and scope of the invention will become apparent to those of skill in the art from the detailed description of the invention and claims that follow.

BRIEF DESCRIPTION OF THE DRAWING

The accompanying drawings, in which like reference numerals refer to identical or functionally-similar elements throughout the separate views and which are incorporated in and form part of the specification, further illustrate the present invention and, together with the detailed description of the invention, serve to explain the principles of the present invention.

In the drawings:

FIG. 5A illustrates a round transmission line pin used in the optoelectronic packaging assembly of FIG. 5 in more detail;

FIG. 13 illustrates a printed circuit board pattern that is suitable for receiving optoelectronic packaging assemblies that are in accord with the principles of the present invention;

FIG. 13A illustrates the printed circuit board pads shown in FIG. 13 in more detail;

DETAILED DESCRIPTION OF THE ILLUSTRATED EMBODIMENTS

References will now be made in detail to various embodiments of the present invention, examples of which are illustrated in the accompanying drawings. Those embodiments relate to novel, unobvious, and useful optoelectronic packaging assemblies. Typically, all body components (such as covers, base, and submount) of the illustrated optoelectronic packaging assemblies are molded from a liquid crystal polymer (such as VECTRA). Those body components are beneficially plated or coated with a conductive material, preferably on both internally and externally. The conductive material electrically connects various features (such as subsequently described transmission line pin shields and cover cavity walls) to electrical ground. The conductive material further provides for electrical shielding that isolates devices within the optoelectronic packaging assemblies from exterior elements, while also reducing or eliminating electrical resonance within the optoelectronic packaging assemblies. However, while most body components are comprised of a liquid crystal polymer, thermally conducting body components can be fabricated from thermally conductive materials such as copper, copper-tungsten, or aluminum nitride.

Optoelectronic packaging assemblies in accord with the principles of the present invention beneficially avoid large interior cavities to reduce resonance frequencies that are on the same order as the operating speeds (i.e. between 5–40 GHz and beyond). Furthermore, breaks, steps, and beveled walls are molded into the body components to reduce parallel plate waveguide modes.

Optoelectronic packaging assemblies in accord with the principles of the present invention beneficially include transmission line pins that have carefully controlled impedances. Such pins reduce signal reflections by providing controlled transmission line effects.

Figure 2:
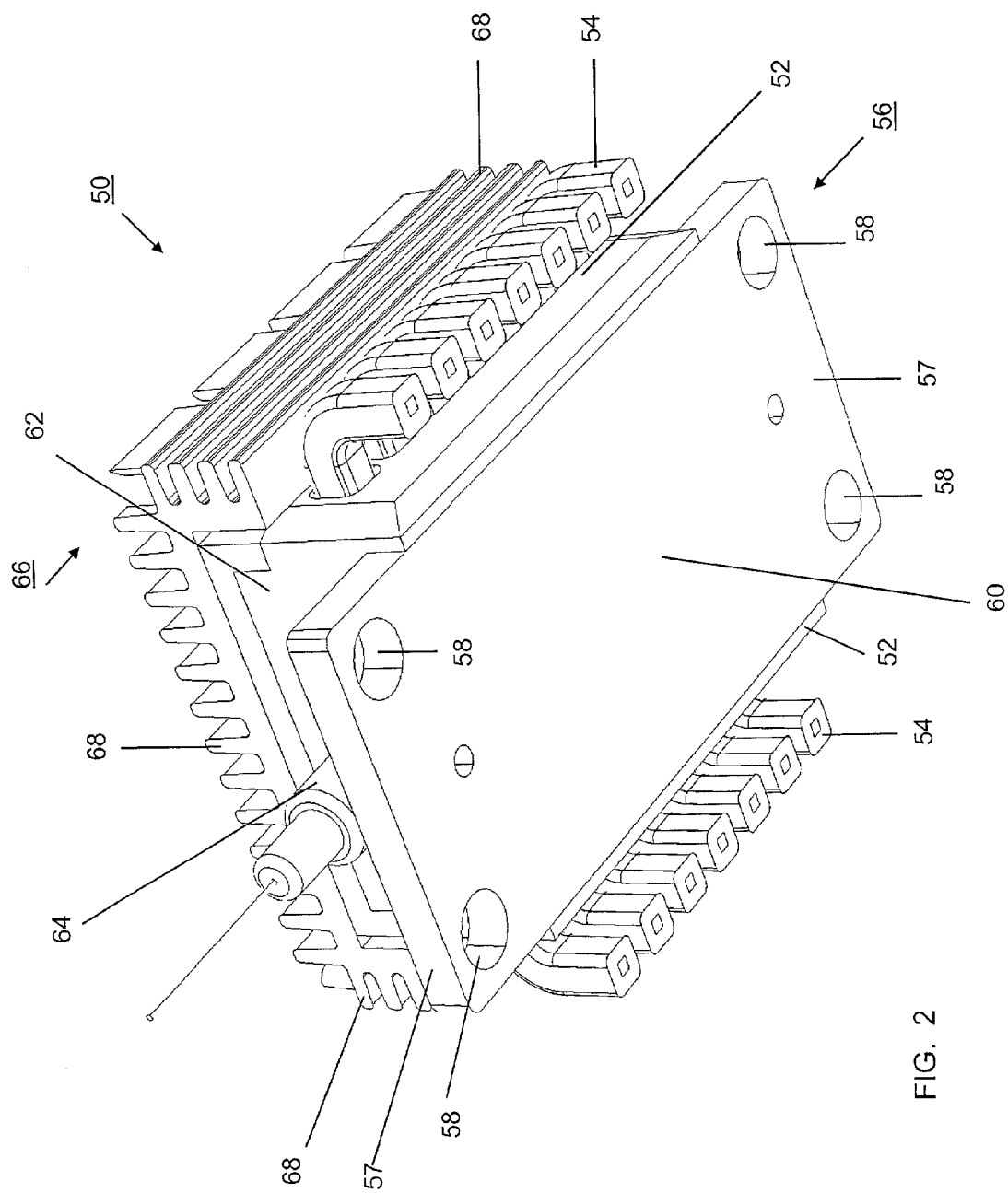
FIG. 2 is a bottom perspective illustration of an optoelectronic packaging assembly that is in accord with the principles of the present invention.

FIG. 2 illustrates a first embodiment optoelectronic packaging assembly 50 that addresses various limitations of the prior art. As shown, the optoelectronic packaging assembly 50 includes a submount 52 that retains transmission line pins 54. Below the submount 52 is a base 56 having mounting flanges 57 with mounting holes 58 for mounting the optoelectronic packaging assembly 50 to an external structure. Beneficially, the base 56 has a flat bottom surface 60 for providing good contact with the external structure. The base 56 further includes a front wall 62 having an extending optical fiber input receptacle 64. The optoelectronic packaging assembly 50 further includes a cover 66 that mates with the remainder of the optoelectronic packaging assembly 50. The cover 66 preferably takes the form of a heat sink having cooling fins 68. Beneficially, the cover 66, the submount 52, and the base 56 form a hermetically sealed package.

In practice, the submount 52, cover 66, and base 56 are comprised of a liquid crystal polymer (such as VECTRA) that is plated or otherwise coated (metallized) with a conductive material, preferably both on internal surfaces and on external surfaces. Additionally, unless otherwise specified, all of body components of the illustrated embodiments are beneficially comprised of plated or coated liquid crystal polymer.

Figure 3:
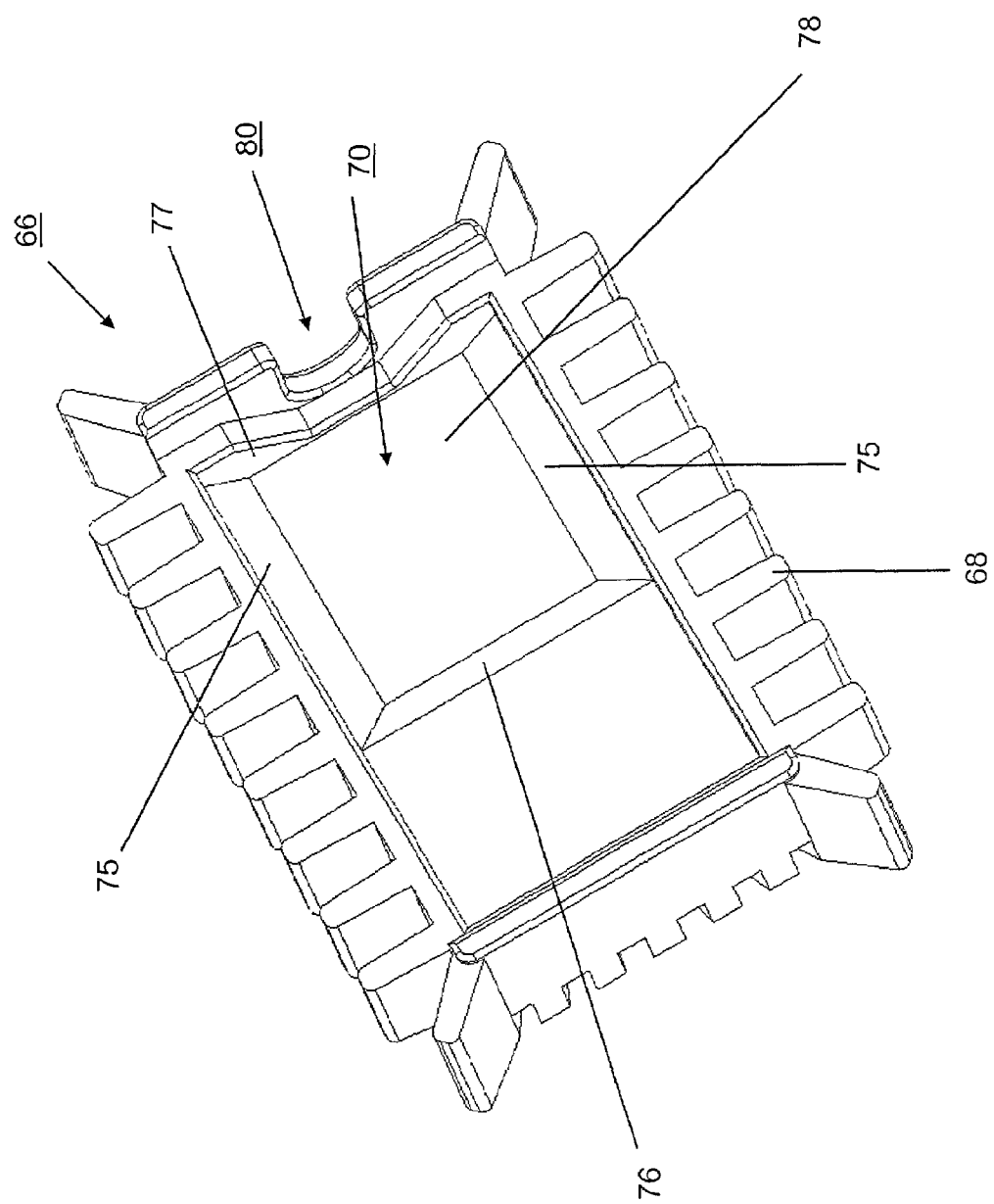
FIG. 3 is a bottom perspective view of a cover that is in accord with the principles of the present invention.

FIG. 3 illustrates the cover 66 in more detail. As shown, the cover 66 includes a cavity 70 defined between beveled sidewalls 75, a back wall 76, and a front wall 77. Completing the cavity is a top surface 78. The front wall 77 optionally includes a relief 80. In some embodiments (but not in the one illustrated in FIG. 2) the relief 80 is dimensioned to receive an optical fiber input receptacle 64 when the cover 66 is in place. In other applications, such as illustrated in FIG. 2, the front wall 77 does not have a relief and thus the cover 66 fits on the front wall 62. The beveled walls, which are coated or plated with a conductive material as previously described, have been shown to reduce resonance of systems within the optoelectronic packaging assembly 50. Furthermore, the cooling fins 68, which are also coated or plated with a conductive material, not only help cool a device or system within the optoelectronic packaging assembly 50, but also reduce resonance.

Figure 4:
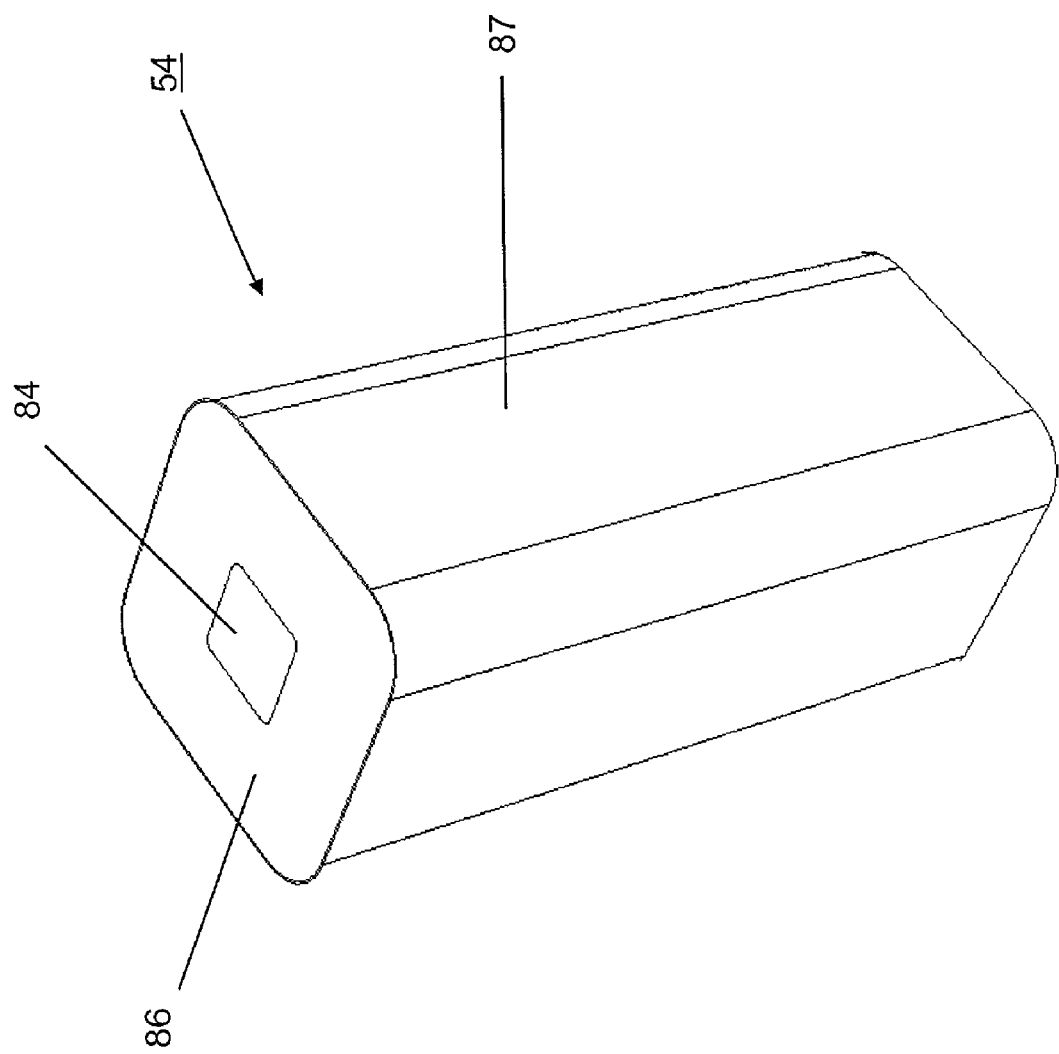
FIG. 4 is a perspective illustration of a transmission line pin that is in accord with the principles of the present invention.

As previously discussed, the submount 52 retains transmission line pins 54. FIG. 4 schematically illustrates one type of transmission line pin 54. As shown, a transmission line pin 54 has an inner conductor (a conductive core) 84, beneficially of copper or another highly conductive material, that is surrounded by a polytetrafluoroethylene sheath 86. Surrounding the sheath 86 is a conductive outer shield 87. The inner conductor 84, sheath 86, and conductive outer shield 87 define a coaxial transmission line. While FIG. 4 illustrates a "rectangular" transmission line pin 54, in practice "round" transmission line pins may be as good or better. Subsequently described embodiments are shown with round transmission line pins (enumerated as 54A). In any event, coaxial-like transmission line pins have a significant benefit in that their impedance can be precisely controlled by varying the ratio of the dimensions of the inner conductor 84 and the conductive outer shield 87.

Figure 1:
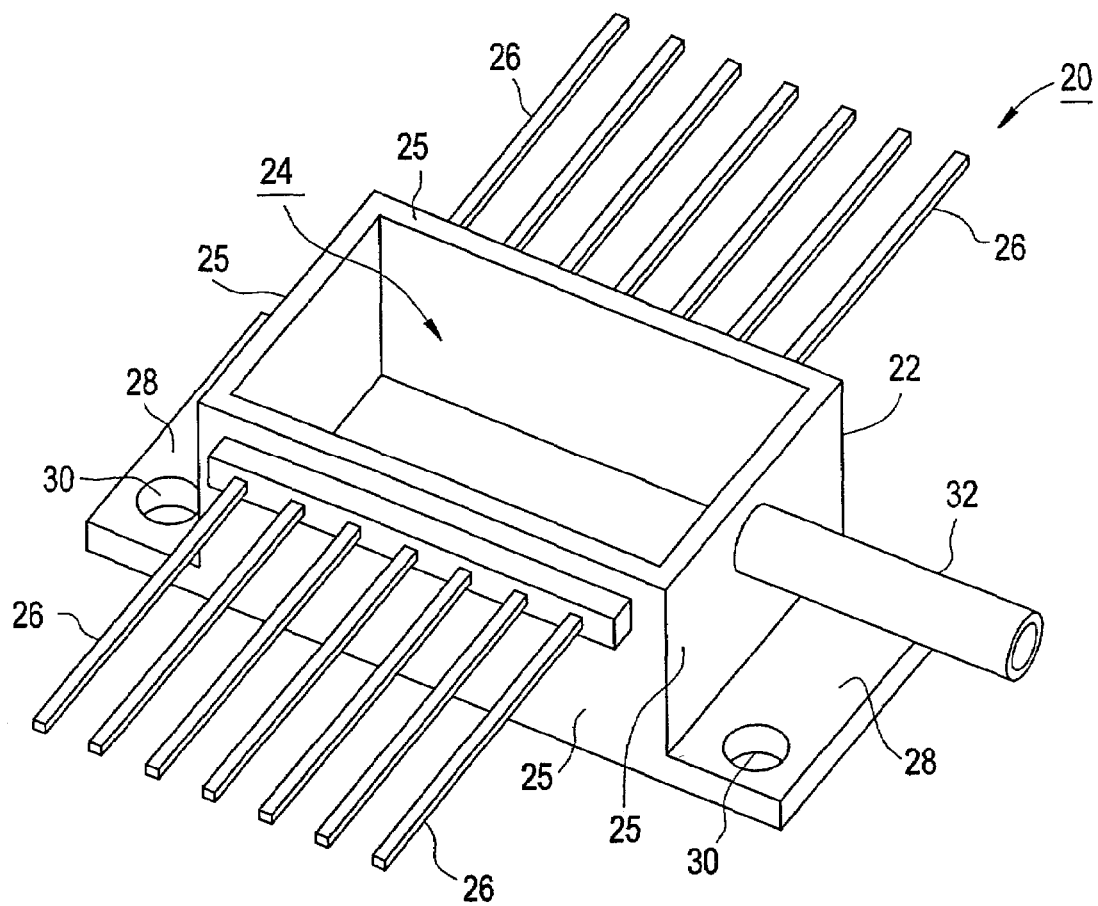
FIG. 1 is a simplified schematic view of a prior art "butterfly" optoelectronic packaging assembly.

Turning back to FIG. 2, the transmission line pins 54 are beneficially insert molded in the submount 52. As the submount 52 is coated or plated with a conductive material, the conductive shields 87 are shorted together. This provides improved reliability of the transmission lines formed by the transmission line pins 54. The transmission line pins 54 improve the electrical performance of the optoelectronic packaging assembly 50 by providing controlled impedance transmission lines. The transmission line pins 54 are beneficially formed into a "standard footprint," typically the same as the butterfly package illustrated in FIG. 1, such that the optoelectronic packaging assembly 50 will mount interchangeably with other optoelectronic packages.

Figure 5:
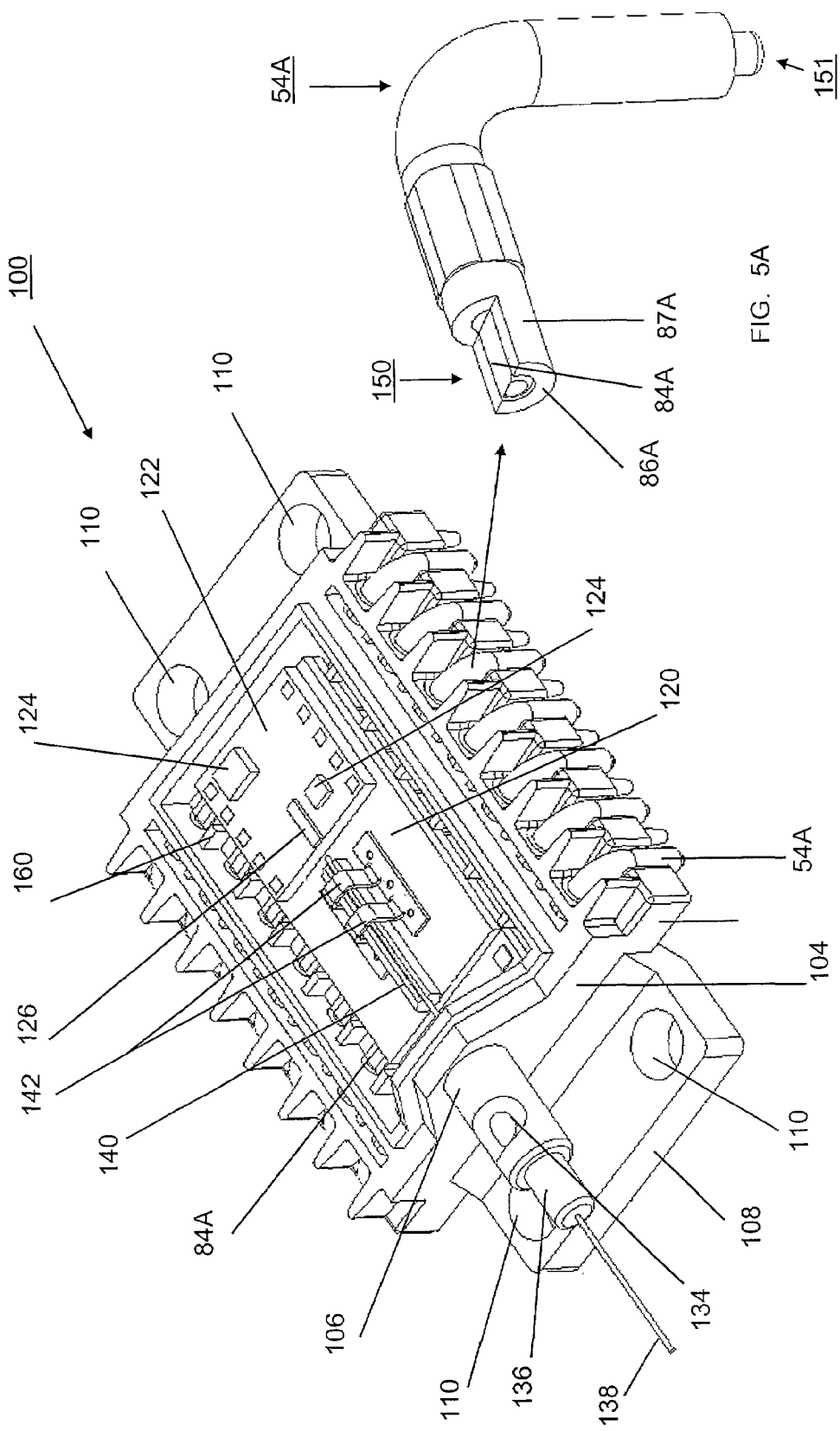
FIG. 5 is a top perspective view of another optoelectronic packaging assembly that is in accord with the principles of the present invention, but without a cover.
Figure 6:
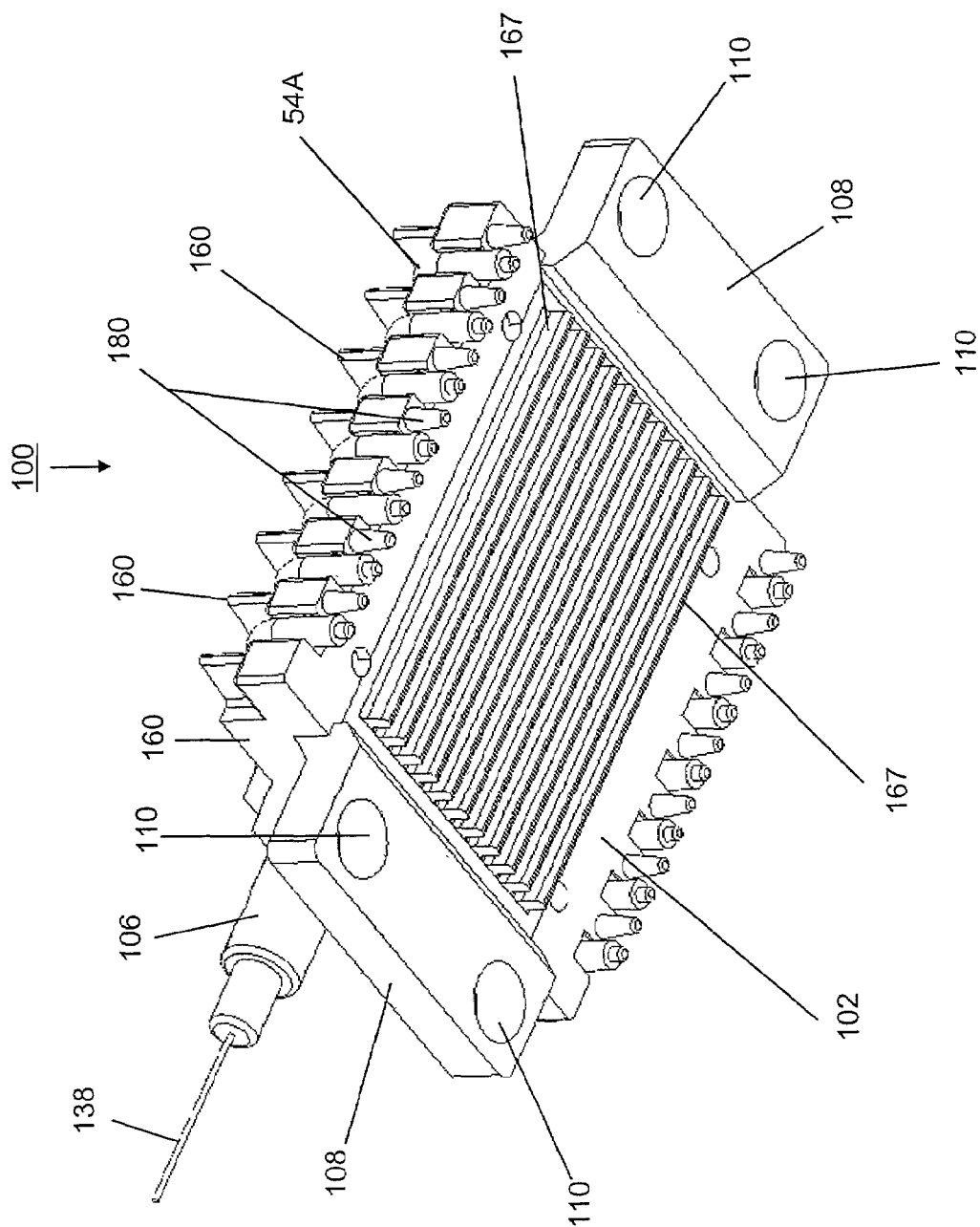
FIG. 6 is bottom perspective view of the optoelectronic packaging assembly illustrated in FIG. 5.
Figure 7:
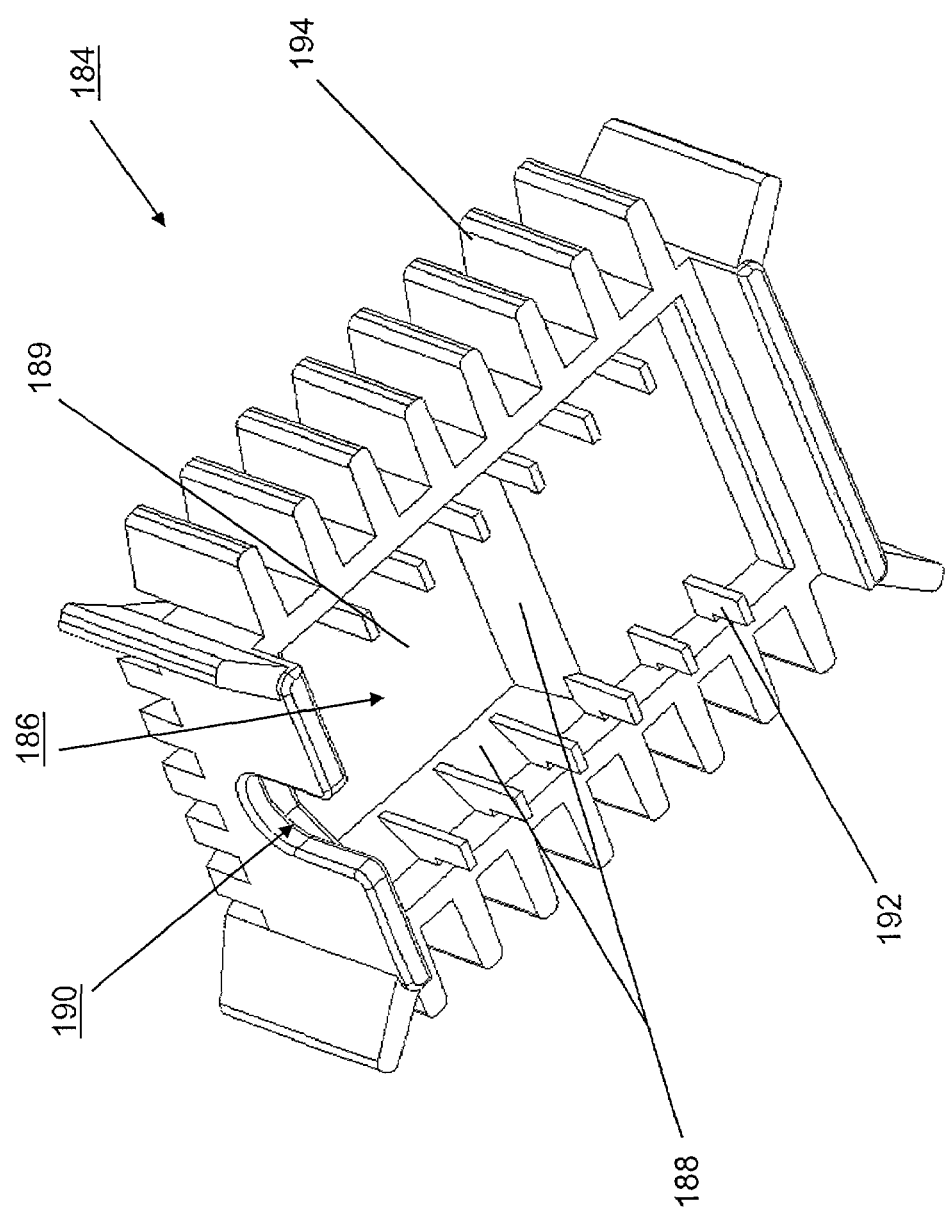
FIG. 7 is a bottom perspective view of another cover that is in accord with the principles of the present invention, and that is particularly beneficial when used with the optoelectronic packaging assembly illustrated in FIGS. 5 and 6.

As mentioned, the transmission line pins can have circular cross-sections. For example, FIGS. 5 and 6 illustrate an optoelectronic packaging assembly 100 with circular transmission line pins 54A, shown in FIG. 5A. FIGS. 5 and 6 do not show a cover to enable a depiction of an interior arrangement. However, FIG. 7 illustrates an example of a suitable cover. As shown, the optoelectronic packaging assembly 100 incorporates round transmission line pins 54A. Also as shown, the packaging assembly 100 incorporates a submount 102 having a front wall 104 with an extending optical fiber input receptacle 106. The submount 102 fits on a base 108 with mounting holes 110 for mounting the optoelectronic packaging assembly 100 to an external structure.

As shown in FIG. 6, the base 108 does not have a flat surface (in contrast to the optoelectronic packaging assembly 50 of FIG. 2). Rather, the base 108 has fins 167 that resemble heat sink fins. However, the main purpose of the fins 167 is resonance reduction. This breaking up of conductive surfaces (the base is coated or plated with a conductive material) by providing steps and/or breaks has been found useful for resonance reduction.

Turning back to FIG. 5, the interior of the optoelectronic packaging assembly 100 includes a raised mount 120 within the submount 102. The raised mount 120 retains a circuit board 122 that electrical interconnects various components 124 (such as drivers, gates, resistors, and/or capacitors) and an electro-optic device 126 (such as a laser diode or LED).

Figure 12:
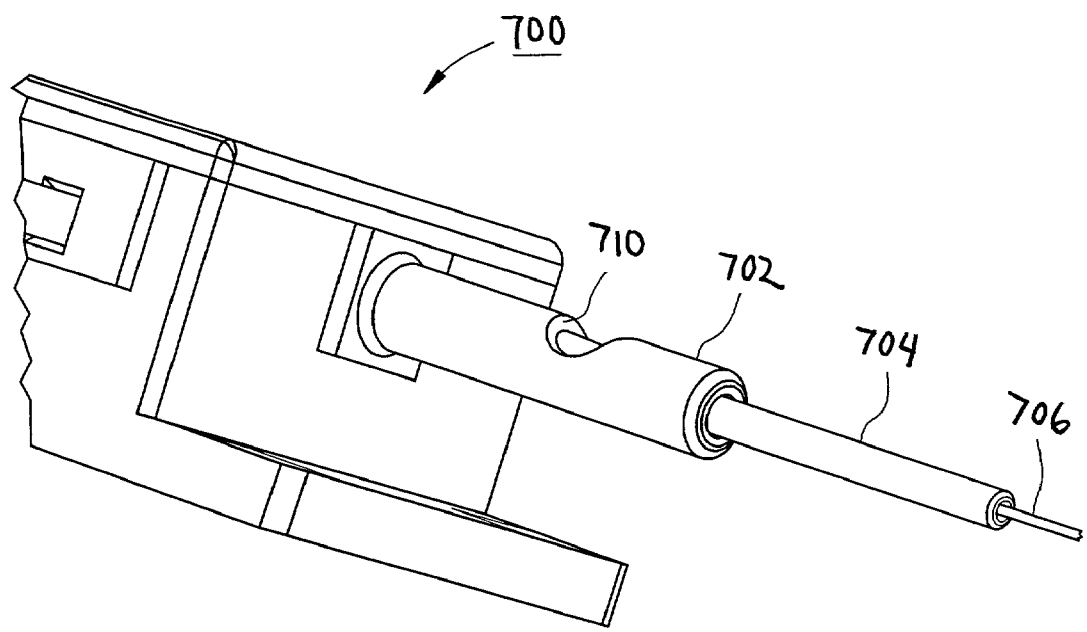
FIG. 12 is a perspective view of an optical fiber retaining feature that is beneficially used with the various embodiments of the principles of the present invention.

Still referring to FIG. 5, the optical fiber input receptacle 106 beneficially includes a "half-moon" shaped slot 134 (described in more detail with respect to FIG. 12). The optical fiber input receptacle 106 retains an optical ferrule 136 that mates with an optical fiber 138. The raised mount 120 and optical ferrule 136 are located and dimensioned such that the optical fiber 138, when inserted into the optical ferrule 136, aligns with the electro-optic device 126. This reduces the difficulty of optical alignment of the optical fiber 138 with the electo-optic device 126. Further assisting optical alignment is an optical spacer 140. The optical spacer 140 is configured to retain and hold the optical fiber 138 such that the optical fiber 138 readily locates relative to the electro-optic device 126. The optoelectronic package 100 further includes clamps 142 for retaining the optical spacer 140 in place.

Referring now to both FIGS. 5 and 6, the transmission line pins 54A incorporate useful features that should be understood as being incorporated in all of the illustrated embodiment optoelectronic packaging assemblies. First, shown in FIG. 5, the interior portion 150 of each transmission line pin (54 and 54A) is sectioned such that the inner conductor 84A, sheath 86A, and conductive outer shield 87A are exposed. This enables easy wirebonding or soldering to the inner conductor 84A. While not shown in FIG. 5, it should be understood that the wirebonding or soldering electrically interconnect the transmission line pins 54A with the circuit board 122 and its components. Additionally, the bottom portion 151 of each transmission line pin is formed such that the last 0.15 mm of the inner conductor 84A is exposed. This enables good electrical contact with an external wiring pattern (reference FIGS. 13 and 14).

Referring to FIGS. 5 and 6, the interior portions 150 of the transmission line pins 54A are separated by barriers 160. The barriers 160 are plated or coated with a conductive material, thus reducing pin-to-pin crosstalk. As shown in FIG. 6, the barriers 160 beneficially align with ground bumps 180. Those bumps ensure that the conductive plating or coating on the optoelectronic packaging assembly 100 is well grounded. Again, this assists resonance reduction and the transmission-line characteristics of the transmission line pins 54A. Beneficially, the optoelectronic packaging assembly 100 is hermetically sealed.

The optoelectronic packaging assembly 100 illustrated in FIGS. 5 and 6 incorporate barriers 160 for reducing pin-to-pin crosstalk. FIG. 7 illustrates a cover 184 that is well suited for use with the optoelectronic packaging assembly 100. As shown, the cover 184 includes a cavity 186 that is partially defined by walls 188 that may be, but are not necessarily, beveled. Completing the cavity is a top surface 189. One wall optionally includes a relief 190 for receiving an optical fiber input receptacle 106 (see FIGS. 5 and 6) when the cover 184 is in place. However, a particular feature of the cover 184 is shield walls 192 that beneficially mate with the barriers 160. The shield walls 192 are coated or plated with a conductive material. There, the shields walls further reduce pin-to-pin crosstalk and signal loss, and reduce resonance. Again, the cover 184 is coated or plated with a conductive material. Furthermore, the cover 184 includes cooling fins 194 that not only help cool the internal systems, but also reduce resonance.

Figure 8:
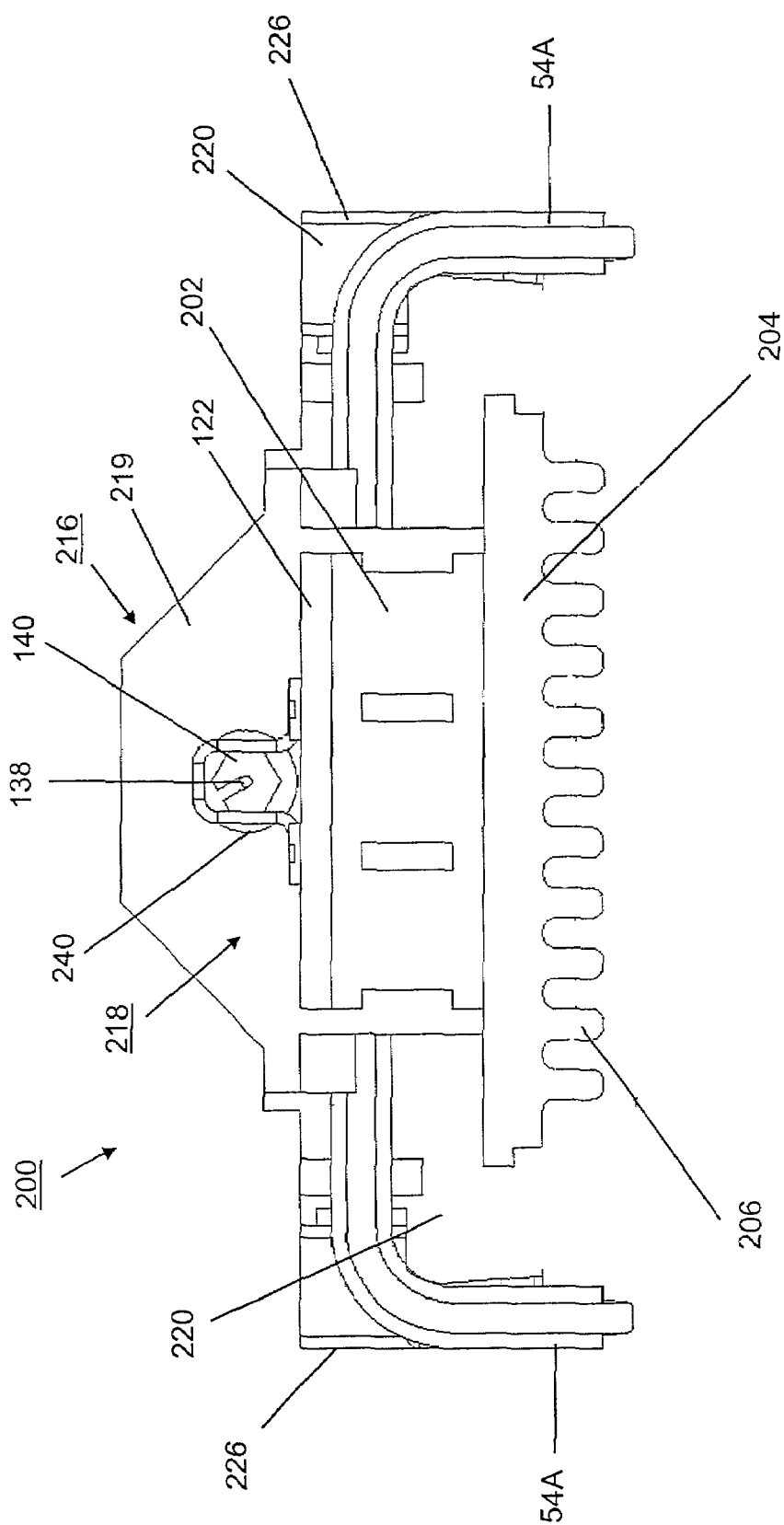
FIG. 8 is a sectional view of yet another optoelectronic packaging assembly that is in accord with the principles of the present invention.

While the optoelectronic packaging assemblies 50 and 100 are beneficial, they are not optimum in all applications. Other embodiments can meet particular operational requirements. For example, FIG. 8 illustrates a cross-sectional view of an optoelectronic packaging assembly 200 that is well suited to high power applications because it incorporates a thermal-electric-cooler 202 (TEC) that includes a Peltier element (which is not shown). The thermal-electric-cooler 202 beneficially mounts on a thermally conductive base 204 (beneficially of copper, copper-tungsten, or aluminum nitride) having protrusions 206. The protrusions 206 are dimensioned to mate with protrusions of a heat sink on an external board (which is not shown). A high power laser diode 240 is mounted in thermal communication with the thermal-electric-cooler 202. The thermal-electric-cooler 202 cools the laser diode 240 and transfers heat to the thermally conductive base 204. The thermally conductive base 204 in turn transfers heat to the heat sink on the external board.

Still referring to FIG. 8, a cover 216 is over a cavity 218 that holds the thermal-electric-cooler 202. The cover includes beveled sidewalls 219 that reduce resonance. Furthermore, the dimensions of the cover and the cavity are minimized, further reducing resonance. The optoelectronic packaging assembly 200 also includes a submount 220 that retains transmission line pins 54A. As best shown in FIG. 8, all of the illustrated embodiments of the principles of the present invention include a conductive coating or plating 226. Also shown in FIG. 8 is the optical spacer 140 that retains and holds the optical fiber 138, and the laser diode 240 that couples light into the optical fiber 138.

Figure 9:
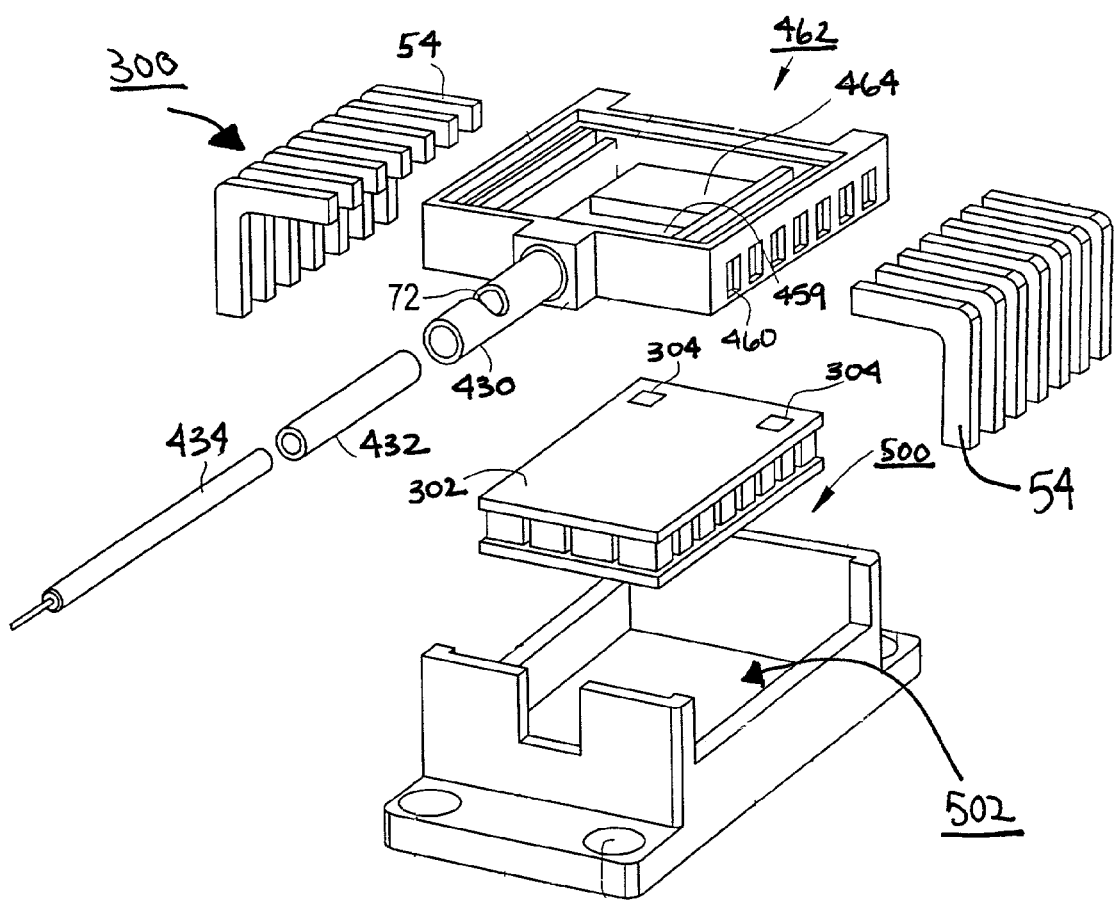
FIG. 9 is an exploded sectional view of yet another optoelectronic packaging assembly that is in accord with the principles of the present invention.

FIG. 9 illustrates a partial exploded view of another optoelectronic packaging assembly 300 having a thermal-electric-cooler 302. As shown, pins 54 mount in holes 460 of a submount 462. The thermal-electric-cooler 302 includes power connectors 304 for receiving power. Still referring to FIG. 9, the submount 462 includes an optical input receptacle 430 for receiving an optical ferrule 432 that mates with an optical fiber 434. The input receptacle 430 includes a "half-moon" shaped slot 72 as described in more detail with respect to FIG. 12. The optical ferrule 432 is inserted through the input receptacle 430, while the optical fiber 434 is inserted into the optical ferrule. The optical ferrule 432 assists optical alignment of an electro-optic device (not shown in FIG. 9) such that an efficient optical transition is made between the electro-optic device and the optical fiber 434. Beneficially, the base 459 of the submount 462 is thermally conductive. Furthermore, the submount 462 includes a thermally conductive mount 464 for receiving the electro-optic device.

Still referring to FIG. 9, the optoelectronic packaging assembly 300 includes a base 500. That base includes a cavity 502 for receiving the thermal-electric-cooler 302. Heat generated in the electro-optic device passes through the thermally conductive mount 464 and the thermally conductive base 459 to the thermal-electric-cooler 302. Electrical input power then removes the heat (by cooling). Optionally, the base is thermally conductive to further assist heat transfer.

Figure 10:
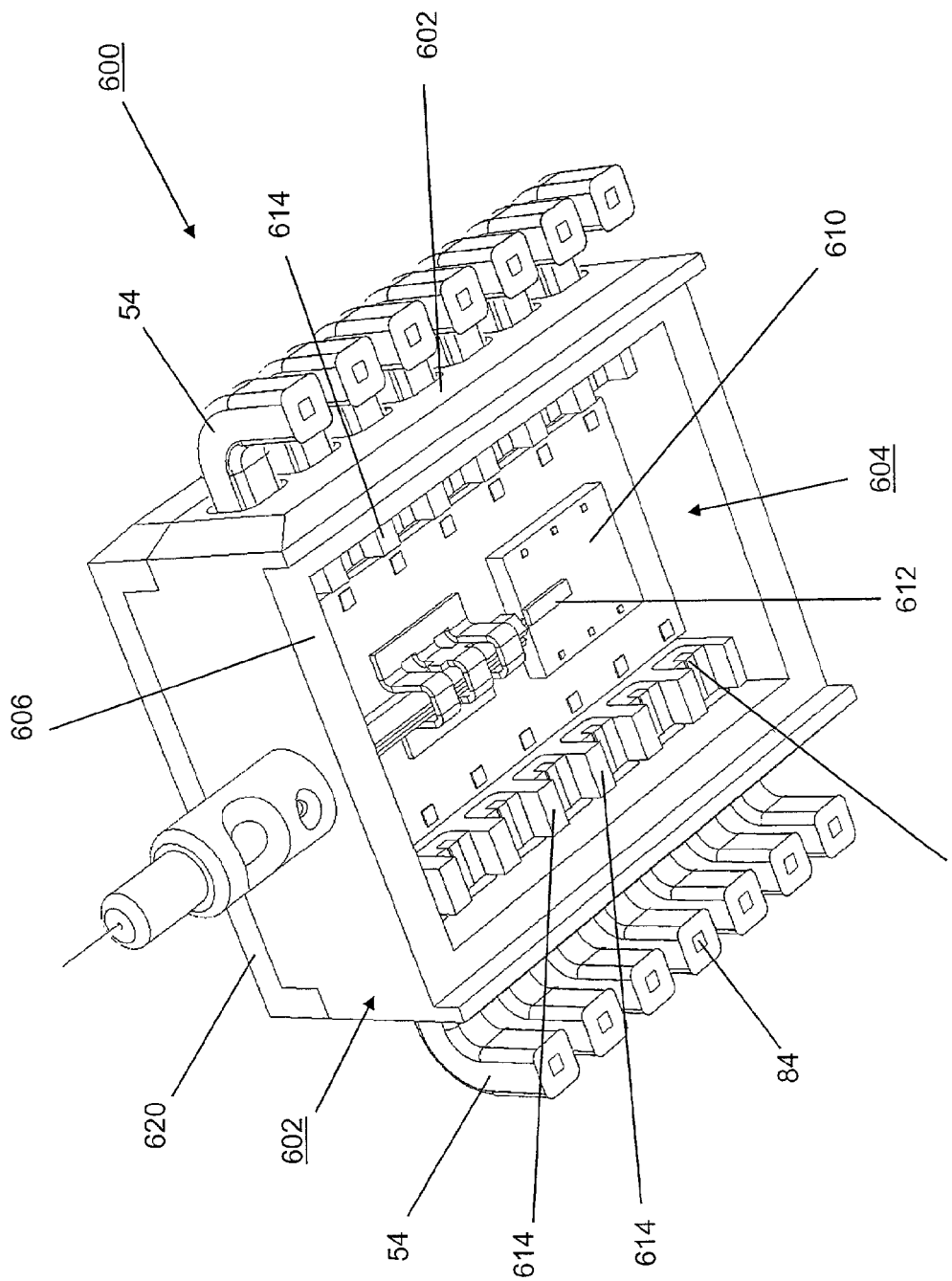
FIG. 10 is a bottom perspective illustration of yet still another optoelectronic packaging assembly that is in accord with the principles of the present invention.

The foregoing examples have the characteristic that the electo-optical device is "top mounted." This is certainly not a requirement. For example, in some applications it is beneficial to "bottom mount" a circuit board and its electo-optical device. FIG. 10 schematically illustrates a bottom mount optoelectronic packaging assembly 600 with its bottom cover removed. As shown, the optoelectronic packaging assembly 600 includes a submount 602 having a cavity 604 that is partially defined by a front wall 606. Transmission line pins 54 pass through the submount 602. As shown in FIG. 10, portions 611 of the inner conductor 84 are exposed. This simplifies internal electrical connections between the inner conductor 84 and a bottom-facing circuit board 610 that retains a laser diode 612 (or other electro-optic device). Between the inner portions 611 are conductive walls 614. As the optoelectronic packaging assembly 600, specifically including the submount 602, is coated or plated with a conductive material (on both interior and exterior surfaces) the walls 614 electrically isolate the inner portions 611 so as to reduce electrical cross-talk between pins.

Still referring to FIG. 10, while the other illustrated embodiments of the principles of the present invention includes covers or bases with fins, this is not required. For example, FIG. 10 shows a cover 620 having a flat surface. The bottom cover (not illustrated) can be flat, or it might have fins to reduce electrical resonance.

Figure 11:
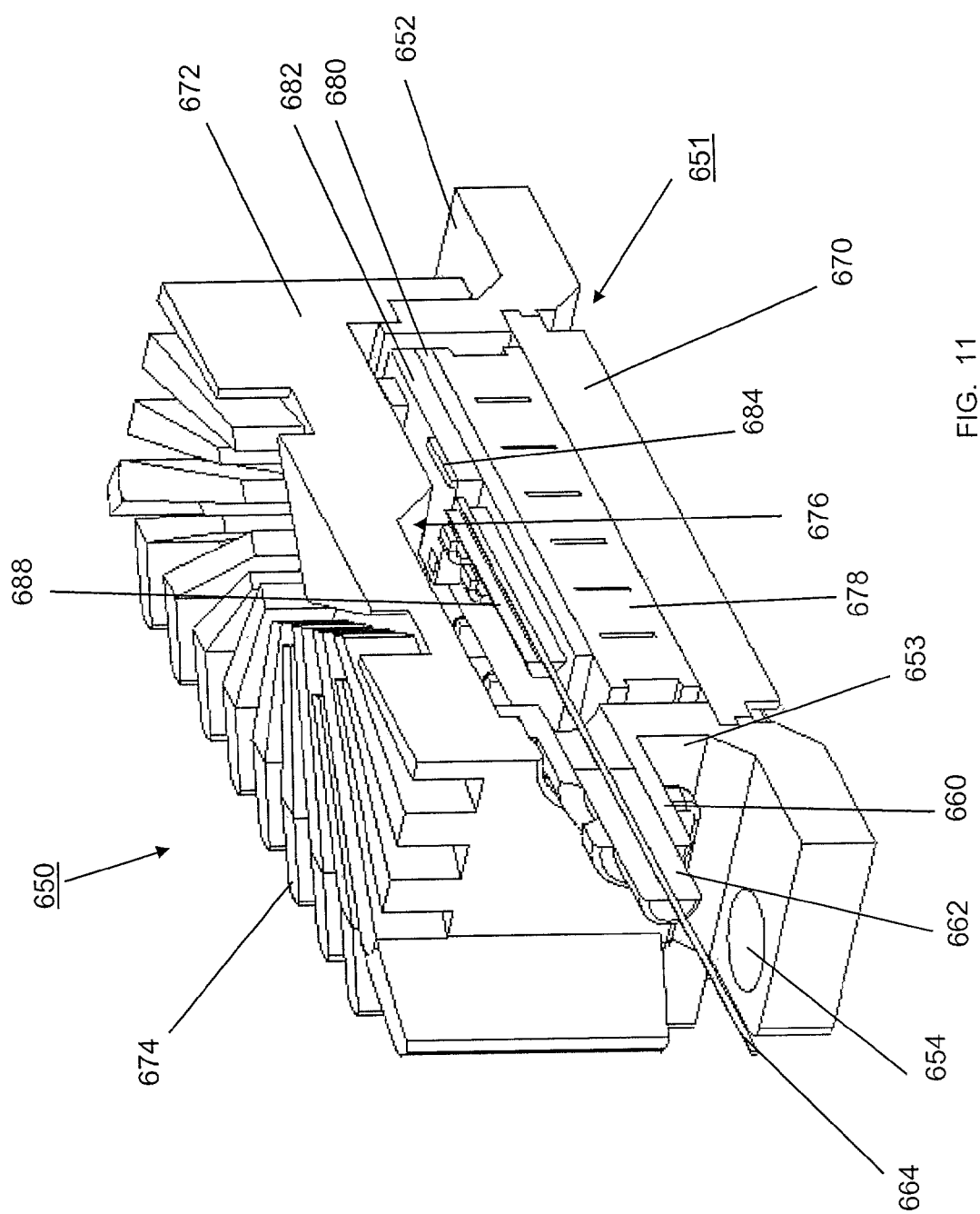
FIG. 11 is a sectional perspective illustration of another optoelectronic packaging assembly that is in accord with the principles of the present invention.

FIG. 11 illustrates yet another optoelectronic packaging assembly 650 that is in accord with the principles of the present invention. That optoelectronic packaging assembly includes a submount that retains transmission line pins 54. However, for clarity, that submount and those pins are not shown in the cut-away view of FIG. 11. Below the submount is a base 651 comprised of ends 652 and 653 (beneficially of a liquid crystal polymer) that form flanges with mounting holes 654 that are used to mount the optoelectronic packaging assembly 650 to an external structure. The end 653 further includes an extending optical fiber input receptacle 660 that receives an optical furrel 662 that retains an optical fiber 664. Between the ends 652 and 653 is a copper (or copper-tungsten or aluminum nitride plate) 670 that is insert-molded into those ends.

Still referring to FIG. 11, the optoelectronic packaging assembly 650 further includes a cover 672 that mates with the remainder of the optoelectronic packaging assembly 650. The cover 672 preferably takes the form of a heat sink having cooling fins 674. As shown, the cover 672 includes beveled walls 676. The cover 672, base 651 and submount (not shown) form a cavity. Within that cavity is an optional thermal-electric cooler 678 that supports a base 680. On that base is a circuit board 682 that holds an electro-optic device 684 and other electrical components. The base 680 further supports an optical spacer 688 that retains and holds the optical fiber 664. Beneficially, the cover 672, the submount, and the base 651 form a hermetically sealed package. Significantly, the cover 672 is formed and dimensioned with beveled walls so as to reduce parallel plate waveguide modes.

All of the illustrated embodiments include an optical input receptacle that receives an optical ferrule. FIG. 12 illustrates a generalized optoelectronic packaging assembly 700 that includes an optical input receptacle 702 that receives an optical ferrule 704. An optical fiber 706 fits into the optical ferrule 704. Furthermore, the optical input receptacle 702 includes a half-moon shaped slot 710. This slot enables an assembly operator to seal the optical ferrule 704 in place in the optical input receptacle 704. This prevents the optical ferrule 704 from moving after assembly. Beneficially, after the optical ferrule is aligned with an electro-optic device within the optoelectronic packaging assembly 700, an operator places a sealant, such as an epoxy in the moon shaped slot 710. The sealant then seals the input receptacle 702 while retaining the optical ferrule 704 in position.

The various illustrated optoelectronic packaging assemblies are all designed to mount on a printed circuit board pattern having standardized connector patterns. FIG. 13 illustrates a suitable printed circuit board. As shown, a plurality of connector patterns 800 is formed on a printed circuit board 802. The connector patterns 800 are dimensioned and positioned to mate with the transmission line pins 54 and 54A. As shown in the exploded view of FIG. 13A, each connector pattern 800 includes an outer conductive pattern 804, an insulating pattern 806, and a signal pattern 808. The outer conductive pattern 804 surrounds the insulating pattern 806, while the insulating pattern 806 surrounds the signal pattern 808. Furthermore, those patterns form a pad area 810. The connector patterns 800 are particularly useful when transferring high speed signals since the outer conductive pattern 804, the insulating pattern 806, and the signal pattern 808 can reduce signal radiation and signal pickup, and because those structures can form a transmission line structure.

Figures 14, 14A:
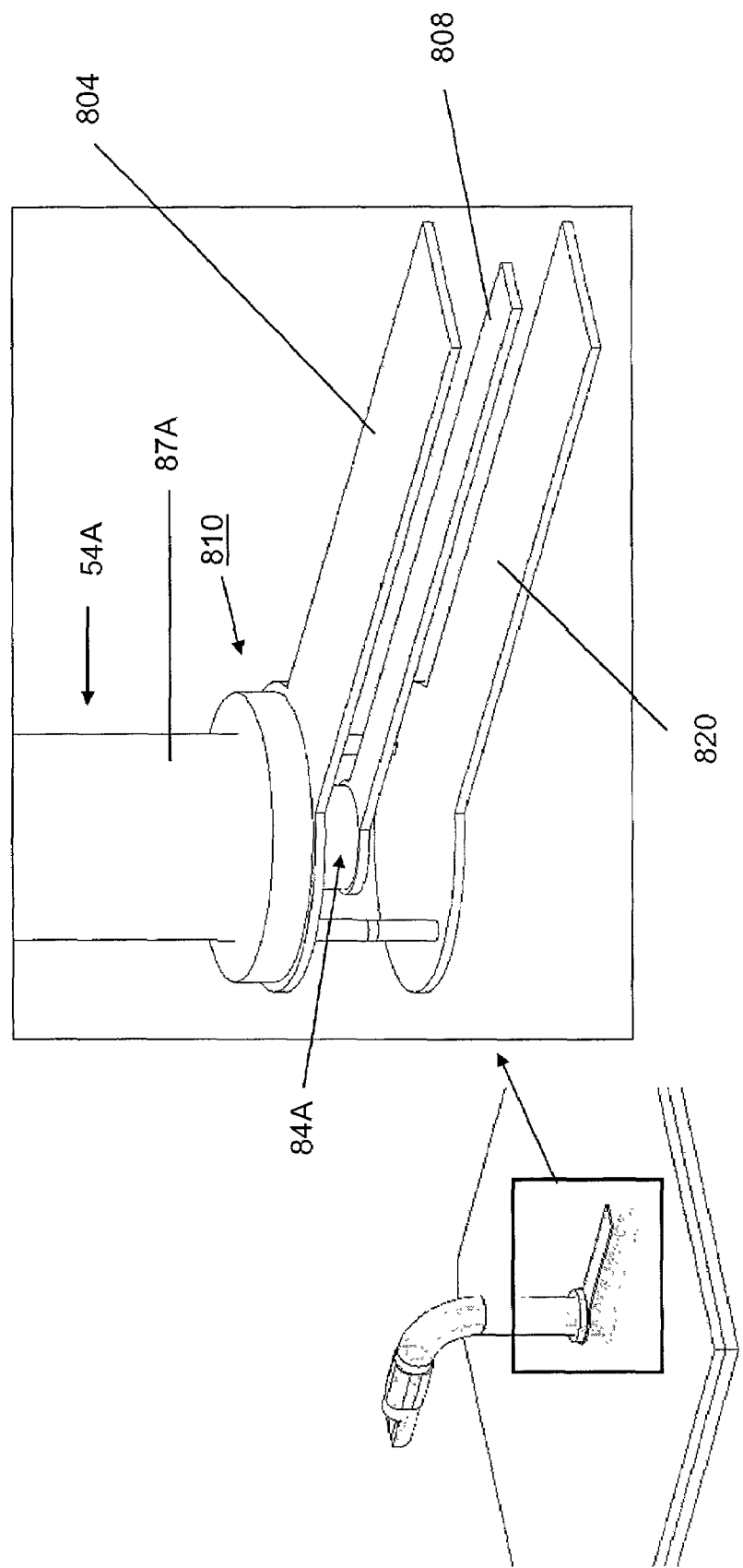
FIG. 14 illustrates connecting a transmission line pin to an external circuit board.
FIG. 14A illustrates one technique of connecting a transmission line pin to an external circuit board.

FIG. 14 illustrates an actual attachment of a transmission line pin 54A to the printed circuit board 802. FIG. 14A illustrate a particular technique of actually attaching a transmission line pin 54A to a circuit board. The end of the transmission line pin 54A is formed such that the sheath 86A (not shown in FIG. 14) and the conductive outer shield 87A are removed from the last 0.15 mm of the conductive core 84A. The transmission line pin 54A is then arranged on a pad 810 such that the inner conductor 84A fits into an opening of the signal pattern 808. The conductive core then connects to a signal pattern 808. Solder, such as solder paste, is used to electrically connect the conductive core 84A to the signal pattern 808. Furthermore, solder connects the conductive pattern 804 to the conductive outer shield 87A. An optional ground plane 820 that connects to the conductive pattern 804 can be included. However, it is important that solder does not short the signal pattern.

While FIG. 14 shows the inner conductor 84A fitting into an opening to contact the signal pattern 808, such is not required. In other applications the signal pattern 808 can be on the surface of a printed circuit board.

The foregoing new optoelectronic packaging assembly designs and technologies address the challenges of interconnecting optoelectronic packaging with high-speed electronic systems. Those designs and technologies provide primarily signal integrity solutions that meet practical problems in manufacturing and multidisciplinary engineering. Such designs and technologies can be critical in achieving high-performance in current and future data- and telecommunications systems.

The embodiments and examples set forth herein are presented to best explain the present invention and its practical application and to thereby enable those skilled in the art to make and utilize the invention. Those skilled in the art, however, will recognize that the foregoing description and examples have been presented for the purpose of illustration and example only. Other variations and modifications of the present invention will be apparent to those of skill in the art, and it is the intent of the appended claims that such variations and modifications be covered. The description as set forth is not intended to be exhaustive or to limit the scope of the invention. Many modifications and variations are possible in light of the above teaching without departing from the spirit and scope of the following claims. It is contemplated that the use of the present invention can involve components having different characteristics. It is intended that the scope of the present invention be defined by the claims appended hereto, giving full cognizance to equivalents in all respects.

What is claimed is:

1. An optoelectronic packaging assembly, comprising:
   a cover having a plurality of shield walls;
   a submount having a plurality of barriers aligned with said plurality of shield walls;
   a plurality of transmission line pins retained within said submount and between said plurality of barriers, wherein said plurality of transmission line pins extend from a cavity within said submount to an exterior of the optoelectronic packaging assembly; and
   a base;
   wherein said cover, said submount and said base mate to form a package for retaining an optoelectronic device, and wherein said plurality of transmission line pins are for conducting electrical signals for the optoelectronic device.

2. An optoelectronic packaging assembly according to claim 1, wherein said transmission line pins have rectangular cross-sections.

3. An optoelectronic packaging assembly according to claim 1, wherein said transmission line pins have circular cross-sections.

4. An optoelectronic packaging assembly according to claim 1, wherein said cover includes a cavity with walls.

5. An optoelectronic packaging assembly according to claim 4, wherein said walls are beveled.

6. An optoelectronic packaging assembly according to claim 1, wherein each transmission signal line pin is comprised of:
   an inner conductor;
   a dielectric sheath; and
   an outer conductive shield.

7. An optoelectronic packaging assembly according to claim 6, wherein said submount, said base, and said cover are comprised of a nonconductive plastic.

8. An optoelectronic packaging assembly according to claim 7, wherein said nonconductive plastic is a liquid crystal polymer.

9. An optoelectronic packaging assembly according to claim 7, wherein said nonconductive plastic is coated with a conductive material.

10. An optoelectronic packaging assembly according to claim 9, wherein said conductive material electrically contacts at least one outer conductive shield.

11. An optoelectronic packaging assembly according to claim 6, wherein said sheath is comprised of polytetrafluoroethylene.

12. An optoelectronic packaging assembly according to claim 6, wherein said inner conductor of each of said plurality of transmission line pins is exposed within said cavity.

13. An optoelectronic packaging assembly according to claim 6, wherein said inner conductor of each of said plurality of transmission line pins is exposed outside said cavity.

14. An optoelectronic packaging assembly according to claim 1, wherein said cover includes fins.

15. An optoelectronic packaging assembly according to claim 1, wherein said plurality of shield walls are each coated or plated with a conductive material.

16. An optoelectronic packaging assembly according to claim 1, wherein inner and outer surfaces of the optoelectronic packaging assembly are electrically conductive.

17. An optoelectronic packaging assembly according to claim 1, further including a raised mount in said cavity.

18. An optoelectronic packaging assembly according to claim 17, further including an electro-optical device on said raised mount.

19. An optoelectronic packaging assembly according to claim 1, wherein said submount includes a plurality of external ground bumps disposed between said transmission line pins.

20. An optoelectronic packaging assembly according to claim 1, wherein said base includes a mounting flange having a mounting hole.

21. An optoelectronic packaging assembly according to claim 1, further including a thermal-electric-cooler.

22. An optoelectronic packaging assembly according to claim 21, wherein said thermal-electric-cooler fits into a cavity and on said base.

23. An optoelectronic packaging assembly according to claim 1, wherein said optoelectronic packaging assembly further includes an optical input receptacle.

24. An optoelectronic packaging assembly according to claim 23, further including an optical ferrule in said optical input receptacle.

25. An optoelectronic packaging assembly according to claim 24, further including an optical fiber inserted into said optical ferrule.

26. An optoelectronic packaging assembly according to claim 25, further including an electro-optical device in said optoelectronic packaging assembly, wherein said electro-optical device is optically coupled to said optical fiber.

27. An optoelectronic packaging assembly according to claim 26, further including an optical spacer that assists optical coupling.

28. An optoelectronic packaging assembly according to claim 27, further including clamps for clamping said optical spacer.

29. An optoelectronic packaging assembly according to claim 23, wherein said cover includes a relief for receiving said optical input receptacle.

30. An optoelectronic packaging assembly according to claim 23, wherein said optical input receptacle includes a half-moon shaped slot.

31. An optoelectronic packaging assembly, comprising:
   a cover;
   a submount retaining a plurality of transmission line pins, each comprised of an inner conductor, a dielectric sheath, and an outer conductive shield, that extend from a cavity within said submount to an exterior of said submount, said submount further including barriers between portions of adjacent transmission line pins within said cavity, wherein a surface of said barriers is coated with have a conductive material; and
   a base;
   wherein said cover, said submount, and said base mate to form a package for retaining an optoelectronic device, and wherein said plurality of transmission line pins are for conducting electrical signals for the optoelectronic device.

32. An optoelectronic packaging assembly according to claim 31, wherein said transmission line pins have circular cross-sections.

33. An optoelectronic packaging assembly according to claim 31, wherein said submount, said base, and said cover are comprised of a nonconductive plastic.

34. An optoelectronic packaging assembly according to claim 33, wherein said nonconductive plastic is a liquid crystal polymer.

35. An optoelectronic packaging assembly according to claim 33, wherein said nonconductive plastic is coated with a conductive material.

36. An optoelectronic packaging assembly according to claim 35, wherein said conductive material electrically contacts at least one outer conductive shield.

37. An optoelectronic packaging assembly according to claim 31, wherein said sheath is comprised of polytetrafluoroethylene.

38. An optoelectronic packaging assembly according to claim 31, wherein said inner conductor of each of said plurality of transmission line pins is exposed within said cavity.

39. An optoelectronic packaging assembly according to claim 31, wherein said inner conductor of each of said plurality of transmission line pins is exposed outside said cavity.

40. An optoelectronic packaging assembly according to claim 31, wherein said cover includes a plurality of interior shield walls that align with said plurality of barriers.

41. An optoelectronic packaging assembly according to claim 31, wherein said cover includes fins.

42. An optoelectronic packaging assembly according to claim 31, wherein said cover includes a relief.

43. An optoelectronic packaging assembly according to claim 31, wherein said cover includes a cavity defined by walls.

44. An optoelectronic packaging assembly according to claim 43, wherein at least one cavity wall is beveled.

45. An optoelectronic packaging assembly according to claim 31, wherein said submount includes a plurality of external ground bumps that are disposed between said transmission line pins.

46. An optoelectronic packaging assembly according to claim 31, wherein said base includes a plurality of fins covered with a conductive material.

47. An optoelectronic packaging assembly according to claim 31, further including an optical input receptacle for retaining an optical fiber.

48. An optoelectronic packaging assembly according to claim 31, wherein said base includes an insert molded thermally conductive plate.

49. An optoelectronic packaging assembly according to claim 48, further including a thermal-electric-cooler on said thermally conductive plate.

50. An optoelectronic packaging assembly according to claim 49, wherein said thermally conductive plate is formed to mate with an external structure.

51. An optoelectronic packaging assembly according to claim 31, wherein said transmission line pins have rectangular cross-sections.

52. An optoelectronic packaging assembly according to claim 31, further including a thermal-electric-cooler.

53. An optoelectronic packaging assembly according to claim 52, wherein said thermal-electric-cooler fits on said base.

54. An optoelectronic packaging assembly according to claim 31, wherein said base includes a flange with mounting holes.

55. An optoelectronic packaging assembly, comprising:
a submount;
a plurality of transmission line pins extending from an interior of said submount to an exterior of said submount, a portion of at least one transmission line pin being electrically shorted to the submount;
an optoelectronic device disposed within said submount and electrically shorted to a portion of at least one transmission line pin;
a cover; and
a base, wherein said cover, said submount, and said base mate to form a package for retaining said optoelectronic device, and wherein said submount, said base, and said cover are comprised of a nonconductive plastic.

56. An optoelectronic packaging assembly according to claim 55, wherein said nonconductive plastic is a liquid crystal polymer.

57. An optoelectronic packaging assembly according to claim 55, wherein said nonconductive plastic has a conductive material on a surface.

58. An optoelectronic packaging assembly, comprising:
a submount;
a plurality of transmission line pins extending from an interior of said submount to an exterior of said submount, a portion of at least one transmission line pin being electrically shorted to the submount; and
an optoelectronic device disposed within said submount and electrically shorted to a portion of at least one transmission line pin;
a cover; and
a base, wherein said cover, said submount, and said base mate to form a package for retaining said optoelectronic device, and, wherein said cover includes a plurality of interior shield walls.

59. An optoelectronic packaging assembly, comprising:
a submount;
a plurality of transmission line pins extending from an interior of said submount to an exterior of said submount, a portion of at least one transmission line pin being electrically shorted to the submount; and
an optoelectronic device disposed within said submount and electrically shorted to a portion of at least one transmission line pin;
a cover; and
a base, wherein said cover, said submount, and said base mate to form a package for retaining said optoelectronic device, and wherein said cover includes a cavity defined by walls.

60. An optoelectronic packaging assembly according to claim 59, wherein at least one cavity wall is beveled.

61. An optoelectronic packaging assembly, comprising:
a submount;
a plurality of transmission line pins extending from an interior of said submount to an exterior of said submount, a portion of at least one transmission line pin being electrically shorted to the submount; and
an optoelectronic device disposed within said submount and electrically shorted to a portion of at least one transmission line pin, wherein said submount includes a plurality of external ground bumps that are disposed between said transmission line pins.

62. An optoelectronic packaging in assembly, comprising:
a submount;
a plurality of transmission line pins extending from an interior of said submount to an exterior of said submount, a portion of at least one transmission line pin being electrically shorted to the submount; and
an optoelectronic device disposed within said submount and electrically shorted to a portion of at least one transmission line pin;

a cover; and a base, wherein said cover, said submount, and said base mate to form a package for retaining said optoelectronic device, and, wherein said base includes an insert molded thermally conductive plate.

63. An optoelectronic packaging assembly according to claim 62, further including a thermal-electric-cooler on said thermally conductive plate.

64. An optoelectronic packaging assembly according to claim 63, wherein said thermally conductive plate is formed to mate with an external structure.

65. An optoelectronic packaging assembly, comprising:

a submount;

a plurality of transmission line pins extending from an interior of said submount to an exterior of said submount, a portion of at least one transmission line pin being electrically shorted to the submount;

an optoelectronic device disposed within said submount and electrically shorted to a portion of at least one transmission line pin;

a cover; and a base, wherein said cover, said submount, and said base mate to form a package for retaining said optoelectronic device, and wherein said base includes a flange with mounting holes.

* * * * *